United States Patent [19]
Behl et al.

[11] Patent Number: 5,886,639
[45] Date of Patent: *Mar. 23, 1999

[54] MEMORY STORAGE DEVICE HOUSING AND COOLING DEVICE

[75] Inventors: Sunny Behl; Jack Friedman, both of San Jose, Calif.

[73] Assignee: Inclose Design, Inc., Campbell, Calif.

[*] Notice: The term of this patent shall not extend beyond the expiration date of Pat. No. 5,673,029.

[21] Appl. No.: 871,621

[22] Filed: Jun. 9, 1997

Related U.S. Application Data

[63] Continuation of Ser. No. 602,011, Feb. 15, 1996, Pat. No. 5,673,029.

[51] Int. Cl.$^6$ .................................................. G08B 21/00
[52] U.S. Cl. .......................... 340/635; 340/584; 361/695; 454/184
[58] Field of Search .................................. 340/635, 584; 361/687, 694, 695, 684; 454/184

[56] References Cited

U.S. PATENT DOCUMENTS

| 4,751,872 | 6/1988 | Lawson, Jr. | 361/695 |
|---|---|---|---|
| 5,121,291 | 6/1992 | Cope et al. | 361/384 |
| 5,171,183 | 12/1992 | Pollard et al. | 454/184 |
| 5,173,819 | 12/1992 | Takahashi et al. | 360/97.03 |
| 5,287,009 | 2/1994 | Heung | 307/141 |
| 5,414,591 | 5/1995 | Kimura et al. | 361/695 |
| 5,438,226 | 8/1995 | Kuchta | 307/125 |
| 5,493,457 | 2/1996 | Kawamura et al. | 369/75.1 |
| 5,511,055 | 4/1996 | Otsuki et al. | 369/75.1 |
| 5,528,454 | 6/1996 | Niklos | 361/695 |
| 5,547,272 | 8/1996 | Paterson | 312/223.2 |
| 5,559,673 | 9/1996 | Gagnon et al. | 361/695 |
| 5,673,029 | 9/1997 | Behl et al. | 340/635 |
| 5,680,295 | 10/1997 | Le et al. | 361/695 |

FOREIGN PATENT DOCUMENTS 295 19 526 U1 | 3/1996 | Germany.

Primary Examiner—Daniel J. Wu
Attorney, Agent, or Firm—Kevin H. Fortin, Esq.

[57] ABSTRACT

A memory storage device housing including a memory storage mounting kit with a memory storage device cooler. The housing also has a memory storage device bay. The mounting kit includes a pair of rails, a frame which interconnects the rails and a fan mounted on the frame. The rails mount a memory storage device such as a hard disk drive within the bay. The fan attaches to the frame and draws air through the bay to cool the memory storage device.

10 Claims, 7 Drawing Sheets

MEMORY STORAGE DEVICE HOUSING AND COOLING DEVICE

CROSS-REFERENCE TO RELATED APPLICATION

This patent application is a continuation of U.S. patent application Ser. No.:08/602,011, filed Feb. 15, 1996, now U.S. Pat. No. 5,673,029.

BACKGROUND OF THE INVENTION

1. Field of the Invention

The present invention generally relates to memory storage device mounting kits. More particularly, the present invention relates to hard drive mounting kits having a cooling device.

2. Previous Art

The demand for memory storage capacity continues to increase. Higher capacity, and more numerous memory storage devices are being employed to meet this demand.

Although some users rely on the higher capacity memory storage devices to meet the user's memory storage needs, other users rely upon memory storage systems having multiple memory storage devices.

A typical memory storage system will include a housing with multiple memory storage device bays. Memory Storage devices mount in the bays. Common memory storage devices include hard disk drives, optical drives, magnetic tape drives and floppy drives.

Desk top computers, computer networks and disk arrays (e.g. PAID systems) generally rely upon any of various types of memory storage systems. High end memory storage systems may contain towers enclosing hundreds of memory storage devices.

Heat within a memory storage housing may be problematic. Adding more memory storage devices which to a housing can increase housing temperature. Heat can reduce the life of electronic components, cause failure and reduce the reliability of a system. Since memory storage systems may loose valuable data during failure, the probability of failure is sought to be minimized.

Several known ways to cool electronic components have been developed. A typical mini-tower computer housing 20 is shown in FIG. 1 having a power supply with an internal fan 22. The fan 22 pumps hot air from the housing and away from the power supply. Cool air is drawn through vents in the housing to replace the hot air pumped by the fan. This cools the power supply and the housing. Cooling the housing increase the useful life of the enclosed electronic components, particularly the power supply.

The system shown in FIG. 1 also has a fan 24 mounted on the central processor. Since the central processor may generate as much heat as a small light bulb, fanning the processor reduces the temperature of the processor. Reducing the temperature of the processor improves the reliability and useful life of the processor and associated components. Heat dissipated from the processor, however, may remain in housing.

The computer housing 20 also includes a fan 26 mounted on a card. The card inserts into a device slot on the mother board. The fan circulates, air within the housing to reduce the temperature of the hottest components. The card mounted fan, however, may not necessarily cause cool air to enter or cause heated air to exit the housing. In time, the housing interior may heat to an undesirable temperature.

Employing multiple disk drives in close proximity especially when the disk drives mount closely i.e. within 2 cm of each other. Excessive heat may reduce the life expectancy and reliability of the hard disk drives. What is desired is a way to cool memory storage devices. What is also desired is a way to cool a memory storage device housing to increase the reliability and useful life of the electronic components contained therein.

SUMMARY OF THE INVENTION

The various objects of the invention which are presented and which will become apparent below are presented by way of example only. These objects are not intended to limit the scope of the present invention. The present invention is to be limited only by the appended claims.

It is an object of the present to provide an apparatus for cooling a memory storage system. It is another object of the invention to provide an apparatus for increasing the reliability and life expectancy of electronic devices.

In accordance with the above objects of the invention and those which will be apparent below, a memory storage device mounting kit includes a frame having a pair of rails. The frame mounts a memory storage device within a memory storage device housing. A fan attaches to the frame for directing air across a memory storage device.

In use, the rails attach to the lateral sides of the memory storage device and mount the memory storage device within the housing. The frame has two ends. The face attaches to one end, between the rails. The fan attaches to the face to direct air across the memory storage device.

BRIEF DESCRIPTION OF THE DRAWINGS

For a further understanding of the objects and advantages of the present invention, reference should be had to the following detailed description taken in conjunction with the accompanying drawing, in which like parts are given like reference numerals and wherein.

DETAILED DESCRIPTION OF THE INVENTION

Figure 1:
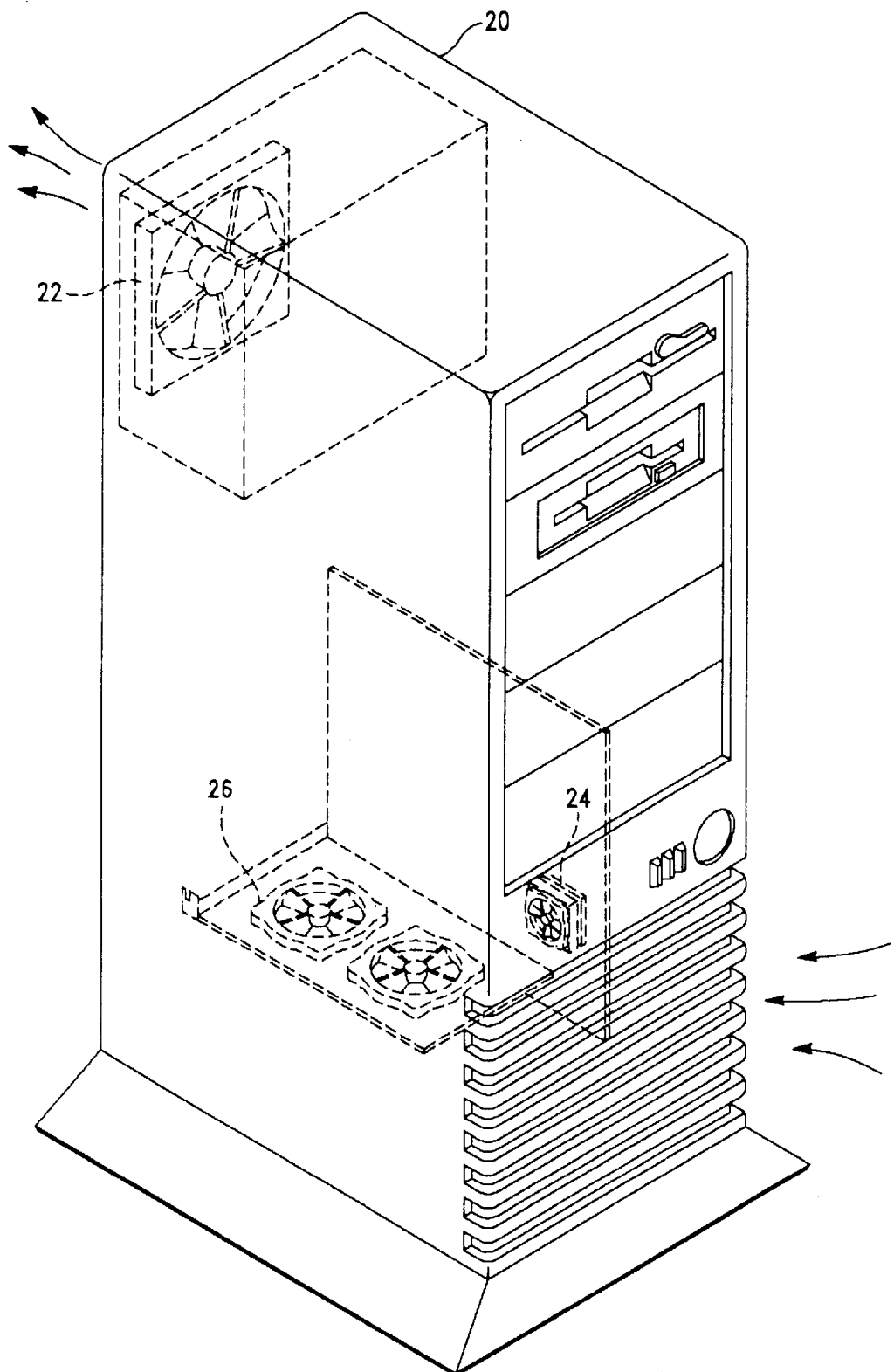
FIG. 1 is a perspective view a known memory storage device housing.
Figure 2:
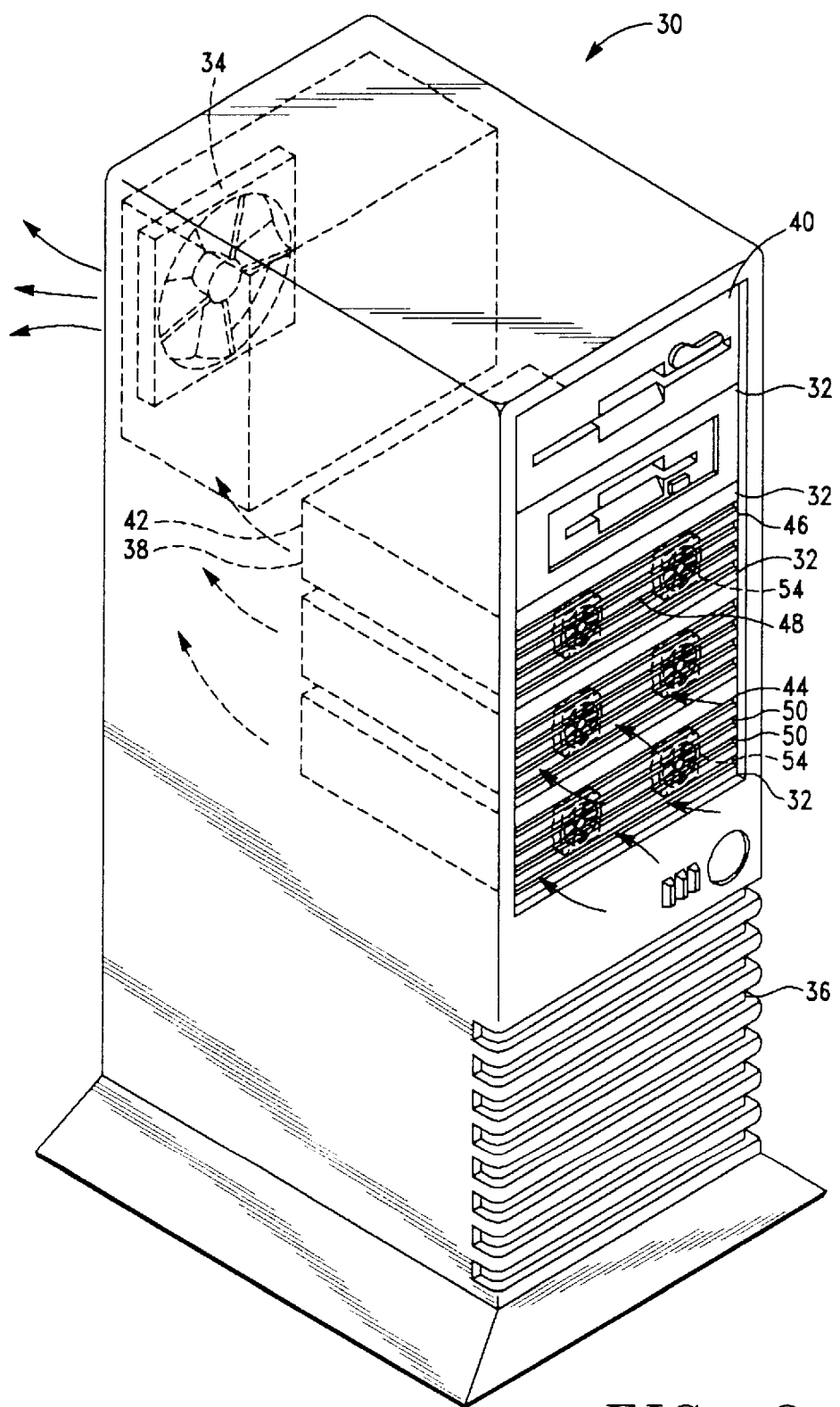
FIG. 2 is perspective view of a memory storage device housing in accordance with the present invention.

With particular reference to FIG. 2, there is shown a memory storage system having a memory storage device housing generally designated with the reference numeral 30. The housing 30 includes multiple memory storage device bays 32. The bays 32 enable multiple memory storage devices to mount in the memory storage device housing 30.

The housing 30 includes a rear portion having a power supply exhaust fan 34 and a front portion which defines a plurality of vents 38. In the housing, various electrical components e.g. memory storage devices may heat air within the housing. The exhaust fan 34 draws the heated air out from the housing 30. The vents 36 enable cool air to enter the housing 30.

Each memory storage device bay 32 has an opening for exposing memory storage devices 42. A hard disk drive 38 mounts on each of the three lower bays 32. A floppy disk drive 40 mounts in each of the two upper bays 32. A bezel 44 mounts on the housing 30 over each bay 32 for holding a hard disk drive 38. The bezel 44 covers the opening and the hard disk drive 38. The bezel 44 is made of a rigid material which protects any exposed portion of the memory storage device from impact.

The bezel 44 defines a periphery 46 and a face 48. The face 48 has an area within the range of 4–10 in$^2$ for covering the memory storage device bay. The face 48 includes a series of vents 50 which enable cool air to pass through the bezel, across the memory storage device 42 and into the housing 30.

A fan 54 mounts on the bezel 44. The fan 54 circulates air through the vents 50 to cool the memory storage device bay 32, the housing 30 and the memory storage device 42. The fan 54 draws air into the housing 50 and forces the air across the top and bottom of the memory storage device 42.

The fan 54 is in close to the memory storage device 42 e.g. within several centimeters. The fan 54 is a standard 12 volt 0.09 amp brushless DC motor fan. The dimensions of the fan 54 are approximately 40 mm×40 mm×10 mm to enable the fan 54 to fit between the bezel 44 and the memory storage device 42.

The location of the fan 54 with respect to the memory storage device 42 is important to maximize convective heat transfer from the memory storage device 42 while minimizing power consumption by the fan 54. This convective heat transfer cools the memory storage device 42 and typically increases memory storage device reliability and useful life.

The fan 54 causes heated air within the housing 30 to flow out from the housing 30. Outflow of heated air from the housing 30 reduces the temperature within the housing 30. Reduced housing temperature typically increases the reliability and useful life of all electrical components (including memory storage devices 42) within the housing 30. The housing vents 38 and the exhaust fan 34 facilitate outflow of heated air.

Figure 3:
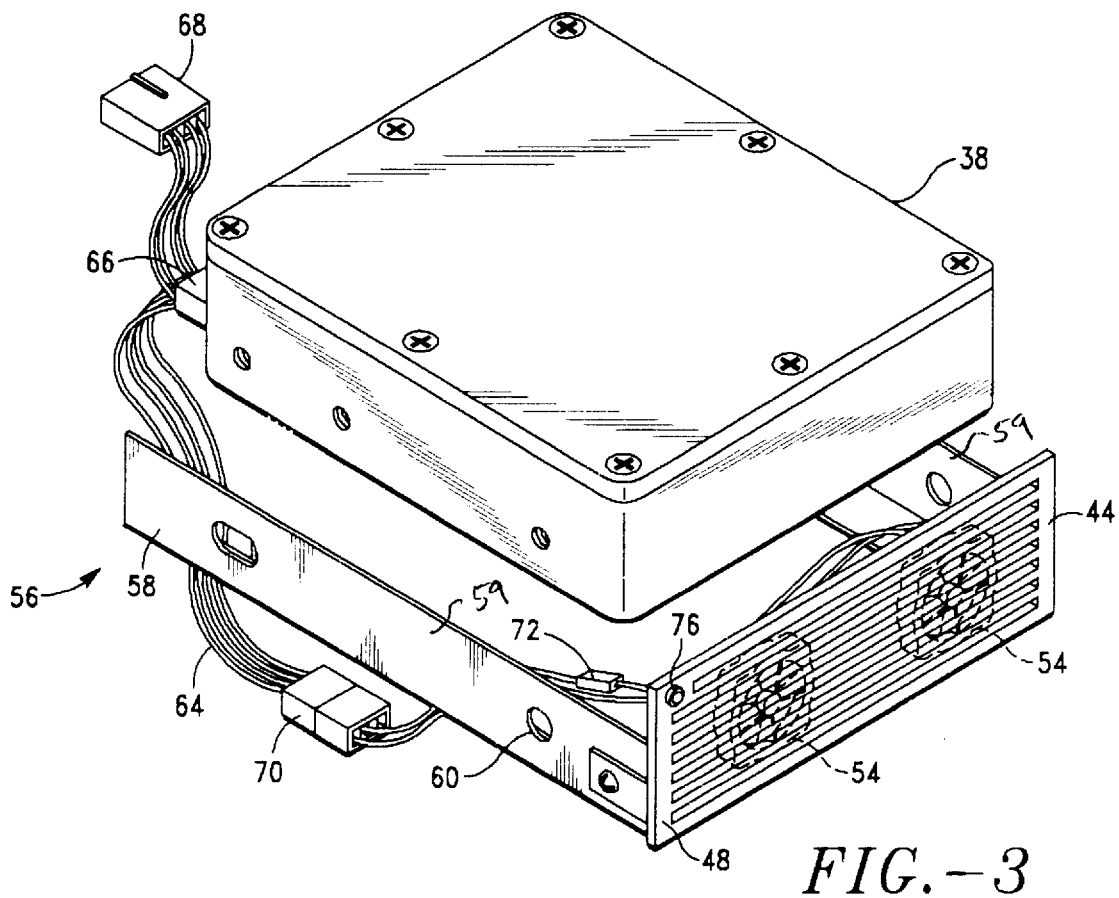
FIG. 3 is a perspective view of a memory storage device mounting kit of FIG. 1.

With particular reference to FIG. 3 there is shown a memory storage device mounting kit generally designated with the reference numeral 56 and a hard disk drive 38. The kit 56 includes a frame 58, the bezel 44 and at least one fan 54. The frame 58 is configured for mounting the hard disk drive 38 within a memory storage device housing. The frame 58 bolts to the bezel 44. The frame 58 includes a pair of hard dive mounting rails 59 with mounting holes 60 for attachment to the hard disk drive 38. Although the frame 58 bolts to the bezel 44, it can be appreciated that the frame 58 may also be attached to the bezel 44 in a variety of ways or, the frame 58 may be formed integral with the bezel 44 in accordance with the present invention.

The fan 54 includes a power cord adapter 64. The adapter 64 includes three ends. The first end 66 attaches to the hard disk drive 38. The second end 68 is attachable to a power supply. The third end 70 electronically attaches to at least one fan 54.

In one embodiment, a current sensor 72 and an indicator 74 electronically attach with the bezel fan 54. The current sensor 72 attaches with the power cord adapter 64 to monitor current flowing to the bezel fan 54. The indicator 74 attaches to the bezel 44 to indicate when the current flowing through the power cord adapter 64 exceeds a predetermined range. Preferably, the indicator 74 includes a LED light 76 which extends through the face 48 of the bezel 44.

The current sensor 72 illuminates the LED 76 when the fan 54 draws current beyond a predetermined range. Illumination of the LED indicates when the fan malfunctions e.g. when the fan has a short. Illumination of the LED also indicates when the fan 54 is overworked such as when the fan 54 is plugged with dust. In an embodiment where the bezel includes an air filter (FIG.4), the LED 76 illuminates when the air filter is plugged and needs to be changed.

Although a current sensor is shown for sensing the operation of the bezel fan, a variety of sensor types and methods may be used to sense such operation. For example, a voltage sensor and appropriate circuitry may be used.

Figure 4:
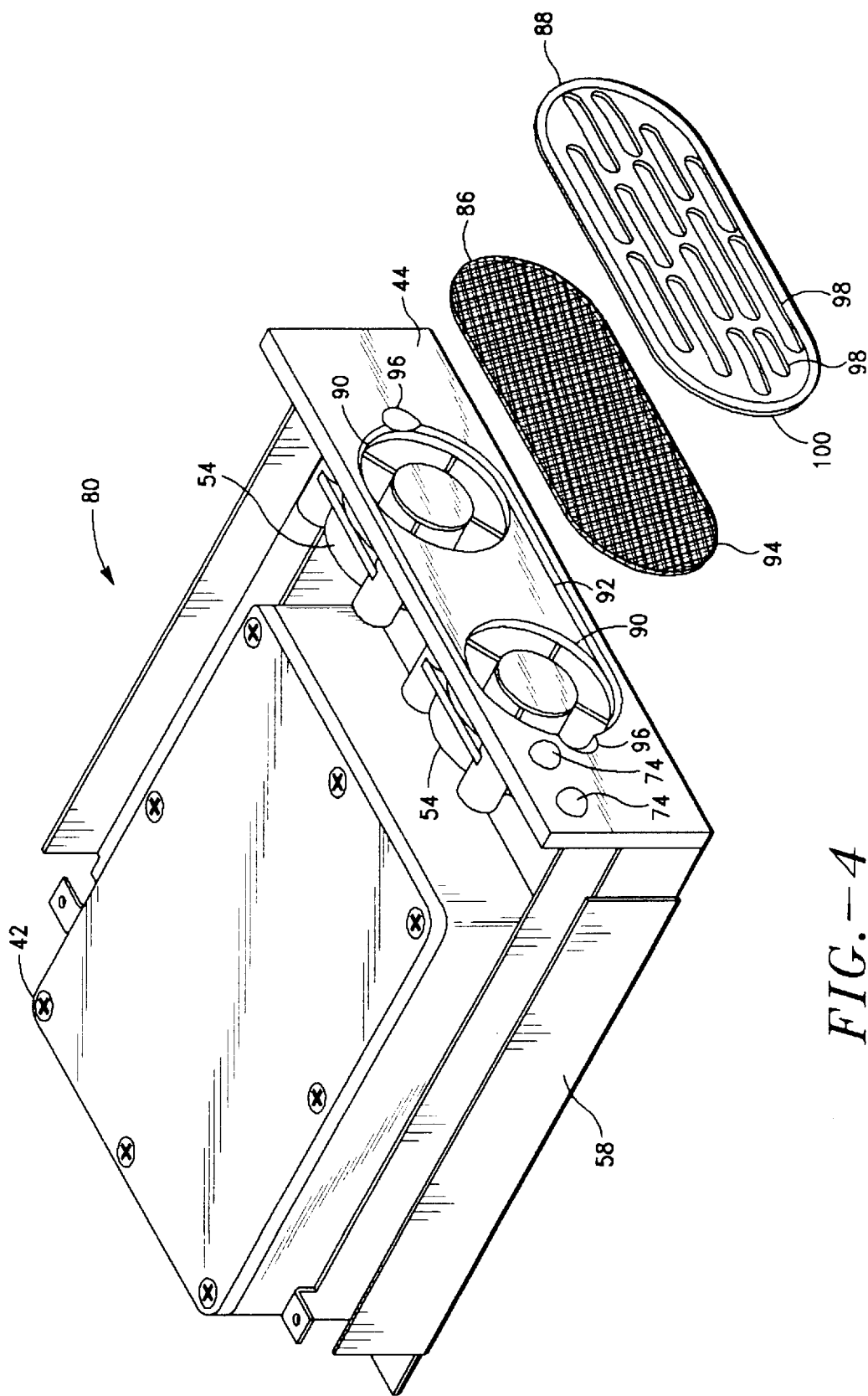
FIG. 4 is a perspective view an embodiment of the memory storage device mounting kit of FIG. 3

With particular reference to FIG. 4 there is shown a memory storage device mounting kit generally designated with the reference numeral 80. The kit includes a bezel 44 having two indicators 74, two fans 54, an air filter 86 and a cover 88.

The indicator 74 includes a LED which illuminates to indicate operation of the memory storage device 42. The other indicator 74 illuminates to indicate fan fault.

The bezel 44 includes a pair of fan openings 90 and a recessed portion 92. Each fan 54 inserts into a respective fan opening 90. The recessed portion 92 surrounds the fan openings 90. The recessed portion 92 is configured for receiving the air filter 86. The recessed portion 92 and air filter 86 are oval shaped. It can be appreciated that although the recessed portion 92 and the air filter 86 are shown oval shaped, any of a variety of shapes can be used in accordance with the present invention.

The air filter 86 has a periphery 94. The periphery 94 of the air filter seats within the recessed portion 92 to maximize filtration of air entering the bezel 44.

The bezel 44 includes a finger slot 96 located at each end of the recessed portion 92 The finger slots 96 enable an operator to grasp the periphery of the air filter 84 and remove the air filter 84 when the air filter 84 seats within the recessed portion 92. The finger slots 96 ease removal and replacement of the air filter 84 and thereby minimize the amount of dust and particles which may escape from the air filter 84 when the air filter 84 is removed from the bezel 44.

The cover 88 is oval shaped to seat within the recessed portion 92 of the bezel 44. When the cover 88 seats within the recessed portion 92, the cover holds the air filter 86 in place over the fan openings 90. The cover 88 has a plurality of vents 98 and an oval periphery 100.

The cover 88 protects the air filter 86 from damage such as damage due to impact. The cover 88 also holds the air filter 86 with a press fit on the bezel 44.

Figure 5:
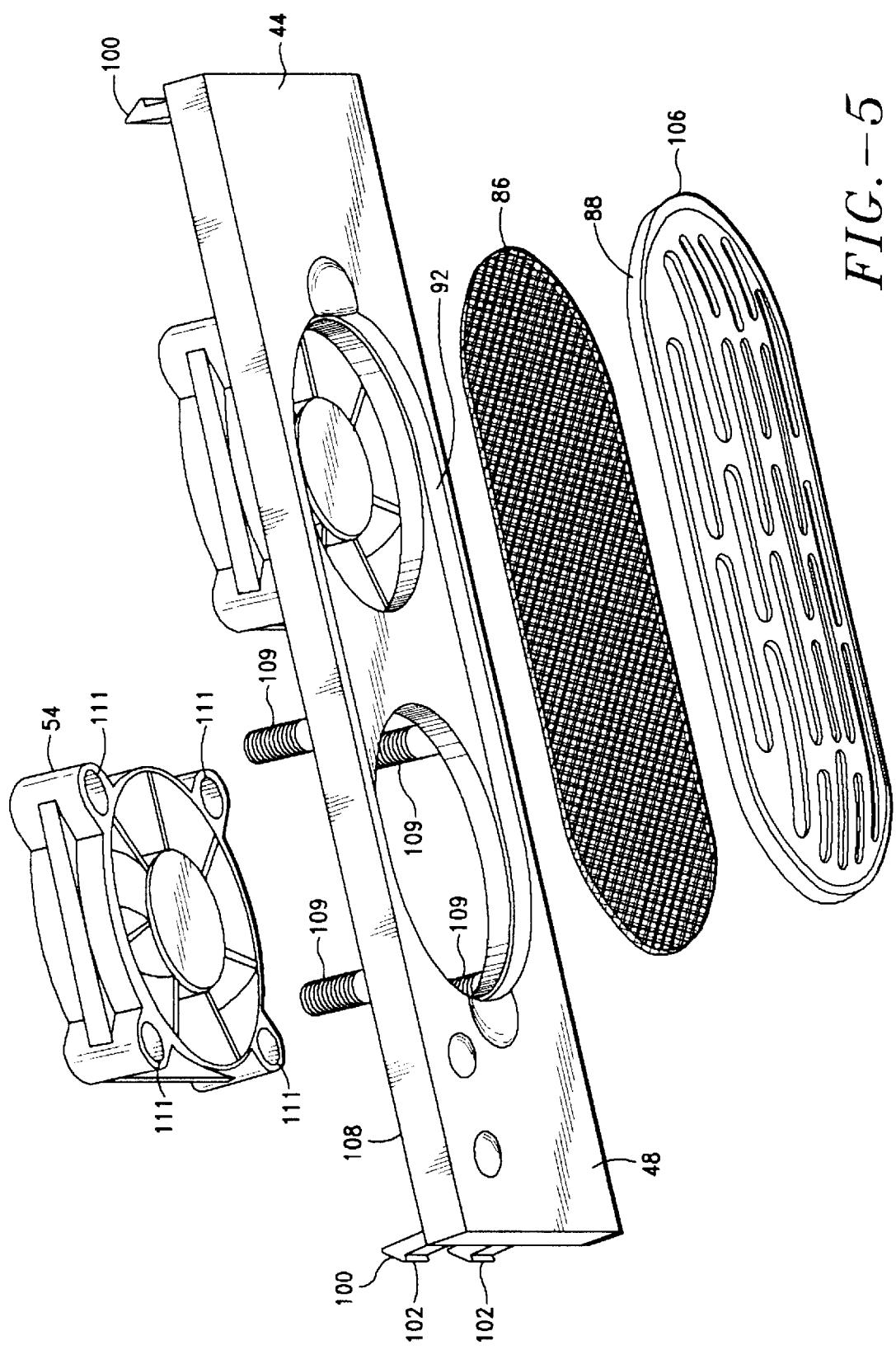
FIG. 5 is an exploded perspective view of an embodiment of the present invention.

With particular reference to FIG. 5, there is shown the bezel 44 of FIG. 4. The bezel 44 includes end snaps 100. The end snaps 100 include a hooked end 102.

The end snaps 100 flex to snap fit the bezel 44 with a memory storage device housing. The end snaps 100 removeably hold the bezel with a memory storage device housing to enable access to a memory storage device and to the fan 54.

The cover 88 has a gasket 106 The gasket 106 surrounds the cover 88 and seals the cover 88 within the recessed portion 92 of the bezel. The gasket 106 holds the cover 88 in place when the cover 88 seals within the recessed portion 92.

The bezel 44 has a rear portion 108. The rear portion 108 includes pins 109 arranged in a square. The fan 54 includes four holes 111. The holes 111 press fit onto the pins 109 to removeably attach the fan 54 with the bezel 44.

It can be appreciated that although the fan 54 mounts on the rear portion 108 of the bezel 44, The fan 54 may also mount on the front portion of the bezel and may be formed integral with the bezel in accordance with the present invention.

Figure 6:
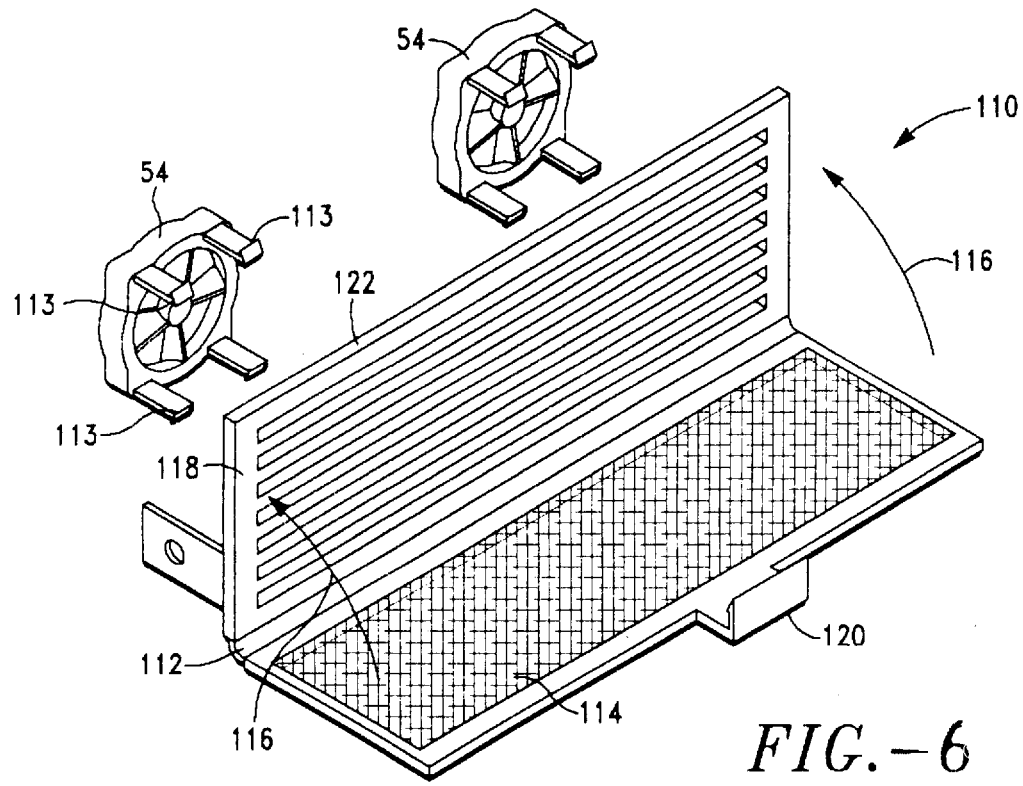
FIG. 6 is a perspective view of an embodiment of the present invention.

With particular reference to FIG. 6 there is shown a bezel in accordance with the present invention, generally designated with the reference numeral 110. The bezel 110 has vents 118, a hinge 112 and an air filter 114. The hinge 112 rotatably attaches the air filter 114 to the bezel 110 to enable the air filter 114 to selectively cover the bezel 110. The air filter 114 moves between an open and closed position.

When the air filter 114 is in an open position as shown, the air filter 114 may be cleaned. The air filter 114 rotates in the direction of the arrows into a closed position wherein the air filter 114 lies against the bezel 110.

The air filter 114 has a latch 120. The bezel 110 has a top edge 122. When the air filter 114 rotates into the closed position, the latch 120 snaps with the top edge 122. In the closed position, the air filter 114 covers a portion of the bezel 110. The air filter 114 is sized in the shape of the bezel 110 so that the air fitter 114 fully covers the bezel 110 and the vents 118 to filter air which passes through the bezel 110.

In one embodiment, the bezel 110 has an area within the range of 7–20 in$^2$ to cover a 5 ¼" memory storage device bay. A 5 ¼" memory storage device bay is typically sized slightly larger than 5 ¼" wide to hold a 5 ¼", memory storage device. The area of the bezel 110 can be varied to accommodate both low profile and high profile memory storage devices.

In another embodiment, the bezel 110 has an area within the range of 4–7 in$^2$ to cover a 3 ½" memory storage device bay. A 3 ½" memory storage device bay is sized slightly larger than 3 ½" wide to hold a 3½" memory storage device. It can be appreciated that as memory storage device sizes change in response to new standards that the bezel size may be adapted accordingly.

The fans 54 include latches 113. The vents 118 are sized to receive the latches 113 of each fan 54. The latches 113 snap within the vents 118 to hold each fan 54 with the bezel 110.

Figure 7:
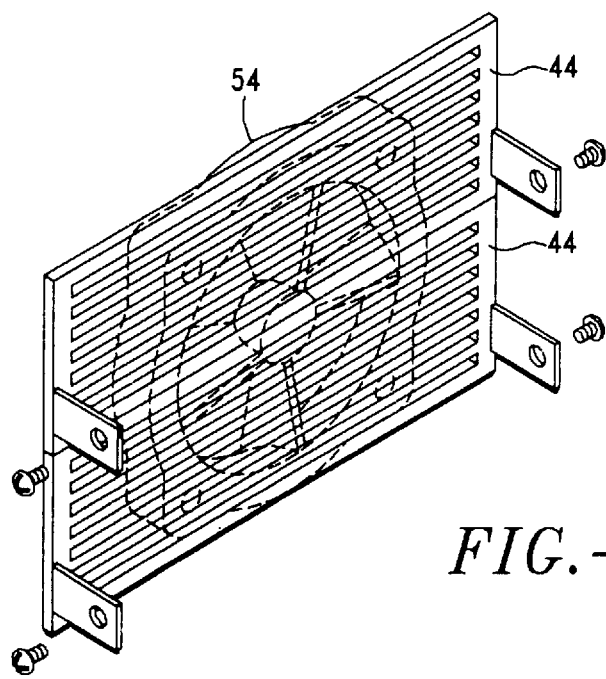
FIG. 7 is a rear perspective view of an embodiment of the present invention.

With particular reference to FIG. 7 there is shown a fan 54 attached to a pair of bezels 44. The fan 54 holds the bezels 44 together in alignment. The bezels 44 are attachable to the memory storage device housing to cover two memory storage device bays.

Figure 8:
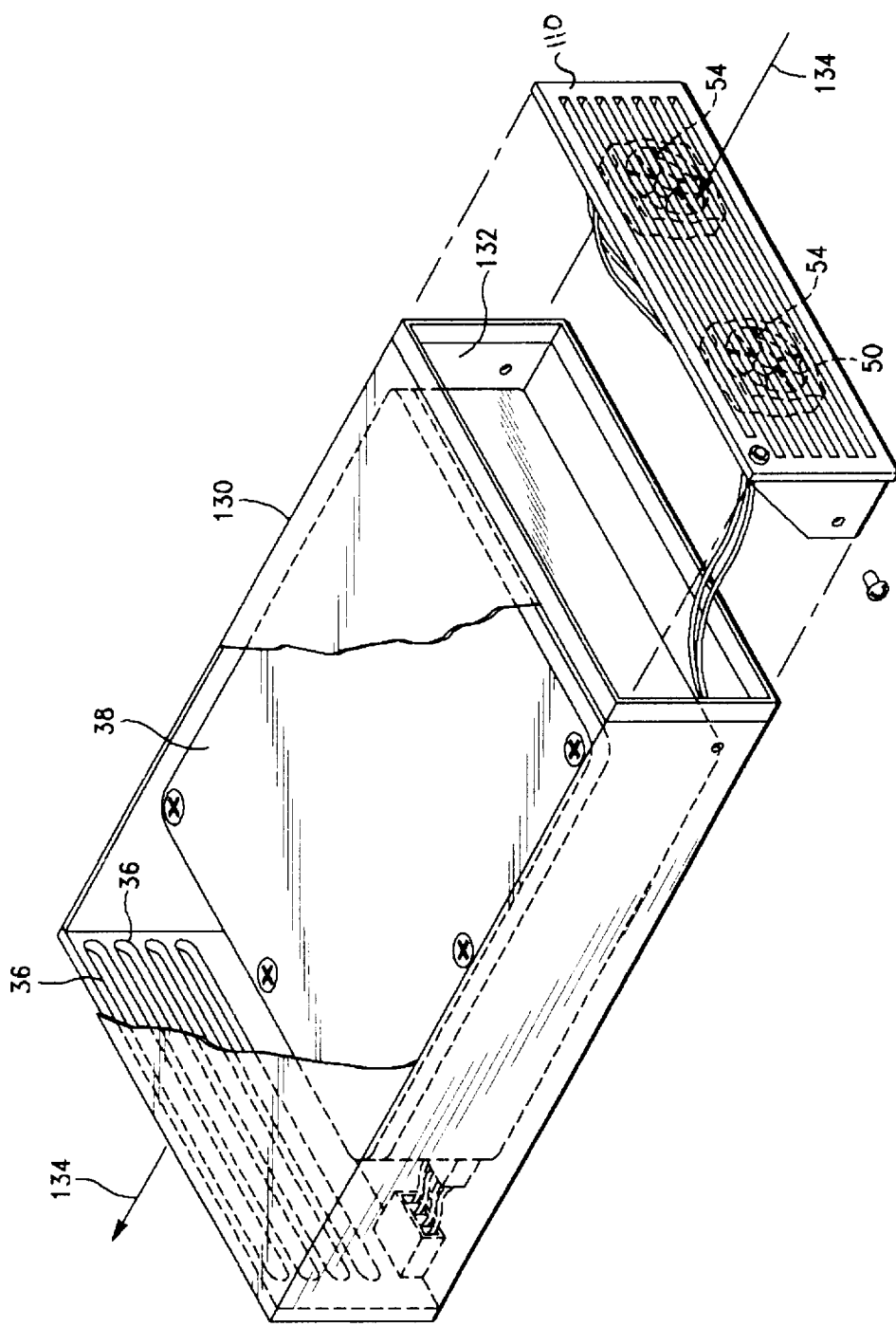
FIG. 8 is a perspective view of an external type memory storage device housing in accordance with the present invention.

With particular reference to FIG. 8, there is shown an external type memory storage device housing 130 and a hard disk drive 38. The external type housing 130 has an interior which defines a memory storage device bay 132 and vents 36. A bezel 44 attaches to the housing 130 and covers the bay 32. The fan 54 pumps air across the hard disk drive 38 and out of the housing 130 in the direction of the arrows 134. Accordingly, the fan 54 cools the hard disk drive 38.

The external type housing 130 is connectable e.g. via a daisy chain to a SCSI bus of a SCSI memory storage system. Accordingly multiple housings 130 may be daisy chained such as commonly accomplished in PAID systems.

While the foregoing detailed description has described various embodiments of the invention it is to be understood that the above description is illustrative only and not limiting of the disclosed invention. Particularly, the specific details of the geometry of bezel may be altered from the rectangular configuration shown. Also, the way the fans mount may be modified. Accordingly, the invention is to be limited only by the claims.

What is claimed is:

1. A memory storage device mounting kit, comprising:
   a frame including a pair of rails for mounting a memory storage device within a memory storage device housing; and
   a fan attachable to the frame for directing air across a memory storage device.

2. A memory storage device mounting kit as set forth in claim 1, wherein the frame attaches to a memory storage device having two lateral sides, the rails attach to the lateral sides of the memory storage device.

3. A memory storage device mounting kit as set forth in claim 2, wherein the frame has two ends, the fan attaches to one end of the frame.

4. A memory storage device mounting kit as set forth in claim 1, wherein the frame includes a face, the face attaches between the rails, the fan attaches to the face.

5. A memory storage device mounting kit as set forth in claim 4, wherein two fans attach to the face.

6. A memory storage device mounting kit as set forth in claim 4, wherein the rails attach to a memory storage device, the face covers a portion of the memory storage device.

7. A memory storage device housing, comprising:
   a memory storage device bay with an opening;
   a facade means being attachable to the bay for covering a portion of the opening, the facade means includes a vent;
   a mount means attached to the bay; and
   a fan attached to the mount means for cooling the memory storage device bay.

8. A housing as set forth in claim 6, wherein the mount means includes a pair of rails for attaching a memory storage device within the bay.

9. A housing as set forth in claim 6, wherein the facade means includes a bezel.

10. A bezel connectable with the bay of a memory storage device housing, comprising:
    a face having an area within the range of 2–20 in$^2$ for covering the bay;
    a fan for circulating air to cool the housing, and
    a means for attaching the fan to the face.

* * * * *